United States Patent
Kawahito et al.

(10) Patent No.: US 12,087,802 B2
(45) Date of Patent: Sep. 10, 2024

(54) SEMICONDUCTOR DEVICE

(71) Applicants: LAPIS SEMICONDUCTOR CO., LTD., Kanagawa (JP); NATIONAL UNIVERSITY CORPORATION SHIZUOKA UNIVERSITY, Shizuoka (JP)

(72) Inventors: Shoji Kawahito, Shizuoka (JP); Keita Yasutomi, Shizuoka (JP); Noriyuki Miura, Kanagawa (JP); Atsushi Yabata, Kanagawa (JP)

(73) Assignees: NATIONAL UNIVERSITY CORPORATION, Shizuoka (JP); LAPIS SEMICONDUCTOR CO., LTD., Kanagawa (JP)

( * ) Notice: Subject to any disclaimer, the term of this patent is extended or adjusted under 35 U.S.C. 154(b) by 385 days.

(21) Appl. No.: 17/679,453

(22) Filed: Feb. 24, 2022

(65) Prior Publication Data

US 2022/0278164 A1 Sep. 1, 2022

(30) Foreign Application Priority Data

Feb. 26, 2021 (JP) ................................ 2021-030218

(51) Int. Cl.
*H01L 27/148* (2006.01)
(52) U.S. Cl.
CPC .............................. *H01L 27/14856* (2013.01)
(58) Field of Classification Search
CPC .............................................. H01L 27/14856
See application file for complete search history.

(56) References Cited

U.S. PATENT DOCUMENTS

| | | | |
|---|---|---|---|
| 7,608,903 B2 * | 10/2009 | Mouli | H01L 27/14645 257/466 |
| 9,231,019 B2 * | 1/2016 | Shimotsusa | H01L 27/1464 |
| 2006/0125038 A1 | 6/2006 | Mabuchi | |
| 2010/0127342 A1 | 5/2010 | Mabuchi | |
| 2011/0084317 A1 | 4/2011 | Mabuchi | |
| 2011/0084351 A1 | 4/2011 | Mabuchi | |
| 2011/0084352 A1 | 4/2011 | Mabuchi | |

(Continued)

FOREIGN PATENT DOCUMENTS

| | | |
|---|---|---|
| JP | 2006173351 A | 6/2006 |
| JP | 2012080045 A | 4/2012 |
| JP | 2014130920 A | 7/2014 |

OTHER PUBLICATIONS

Sanggwon Lee et al., "A Time-of-Flight Range Sensor Using Four-Tap Lock-In Pixels with High near Infrared Sensitivity for LiDAR Applications," Sensors, 2020, vol. 20, No. 116, www.mdpi.com/journal/sensors, pp. 1-16.

*Primary Examiner* — Seung C Sohn
(74) *Attorney, Agent, or Firm* — VOLENTINE, WHITT & FRANCOS, PLLC (57) ABSTRACT

A semiconductor device in which an SOI substrate having an element region in which circuit elements are formed, an insulation layer having a first surface adjoining the SOI substrate, and a support substrate of a first conductivity type are laminated. On the SOI substrate, a transfer electrode configured to transfer charges generated in the support substrate to a third semiconductor layer is formed in a region different from the element region, and the transfer electrode and the third semiconductor layer are adjacent in plan view.

3 Claims, 7 Drawing Sheets

(56) References Cited

U.S. PATENT DOCUMENTS

| | | |
|---|---|---|
| 2011/0086463 A1 | 4/2011 | Mabuchi |
| 2012/0086079 A1 | 4/2012 | Kasai et al. |
| 2014/0038342 A1 | 2/2014 | Mabuchi |
| 2017/0125463 A1 | 5/2017 | Mabuchi |

* cited by examiner

SEMICONDUCTOR DEVICE

CROSS-REFERENCE TO RELATED APPLICATION

This application is based on and claims priority under USC 119 from Japanese Patent Application No. 2021-030218 filed on Feb. 26, 2021, the disclosure of which is incorporated by reference herein.

BACKGROUND

Technical Field

The present disclosure relates to a semiconductor device.

Related Art

Time-of-Flight (ToF) sensors that use the time-of-flight of light to acquire distance images are generally known as a type of sensor used to measure distances to objects. ToF distance image sensors use a solid-state imaging device equipped with a semiconductor device having pixels equipped with photodiodes for detecting light for distance measurement to acquire distance images.

ToF sensors are expected to be applied to advanced driver assistance in drones or automobiles, for example, and are gaining attention. Although the direct ToF method is predominant in these applications, the pixel circuit is complicated and it is difficult to enhance spatial resolution. Meanwhile, distance image sensors utilizing the indirect ToF method, which calculates time indirectly from the quantity of light measured, have a simple pixel structure and are advantageous for realizing distance image sensors with a high spatial resolution.

Semiconductor devices in which photodiodes for detecting light and transistors are formed on the same semiconductor substrate are generally known as semiconductor devices used in solid-state imaging devices. As this type of semiconductor device, for example, Japanese Patent Application Laid-open (JP-A) No. 2014-130920, JP-A No. 2006-173351, and JP-A No. 2012-080045 disclose semiconductor devices using a silicon-on-insulator (SOI) substrate in which is buried an oxide film (insulation layer) called buried oxide (BOX).

ToF sensors are often utilized outdoors. For that reason, there is a strong demand for the development of elements capable of withstanding outdoor utilization for use in ToF sensors. In outdoor applications, it is necessary to use a wavelength around 940 nm where there is a drop in the solar spectrum, but a reduction in quantum efficiency on the imaging element side and a degradation in time response become problems. Particularly over long distances, high quantum efficiency is needed to effectively use light source power, which is limited by eye-safe wavelengths.

SUMMARY

A semiconductor device according to an aspect of the present disclosure in which an SOI substrate having an element region in which circuit elements are formed, an insulation layer having a first surface adjoining the SOI substrate, and a support substrate of a first conductivity type are laminated. The semiconductor device includes a first semiconductor layer of the first conductivity type, which is provided at a second region different from a first region corresponding to the element region and is formed on the support substrate adjoining a second surface opposite the first surface of the insulation layer adjoining the SOI substrate, a second semiconductor layer of the first conductivity type, which is provided at a region that includes at least a region covering the first semiconductor layer and the first region and is a partial region formed on the support substrate adjoining the second surface of the insulation layer, a third semiconductor layer of a second conductivity type, which is formed on the support substrate adjoining the second surface of the insulation layer, a fourth semiconductor layer of the second conductivity type, which forms a potential barrier and is provided between the support substrate and a part of the second surface of the insulation layer provided with the first semiconductor layer, the second semiconductor layer, and the third semiconductor layer formed on the support substrate adjoining the second surface of the insulation layer, and an electrode layer of the first conductivity type, which is provided on a surface of the support substrate opposite a surface adjoining the third semiconductor layer and is configured to apply a potential that depletes the support substrate, wherein on the SOI substrate, a transfer electrode configured to transfer charges generated at the support substrate to the third semiconductor layer is formed in a region different from the element region, and the transfer electrode and the third semiconductor layer are adjacent in plan view.

BRIEF DESCRIPTION OF THE DRAWINGS

An exemplary embodiment of the present disclosure will be described in detail based on the following figures, wherein.

DETAILED DESCRIPTION

An example of an embodiment of the disclosure will be described below with reference to the drawings. It will be noted that identical or equivalent constituent elements and parts in the drawings are assigned identical reference signs. Furthermore, dimensional proportions in the drawings are exaggerated for convenience of description and may differ from actual proportions.

Figure 1:
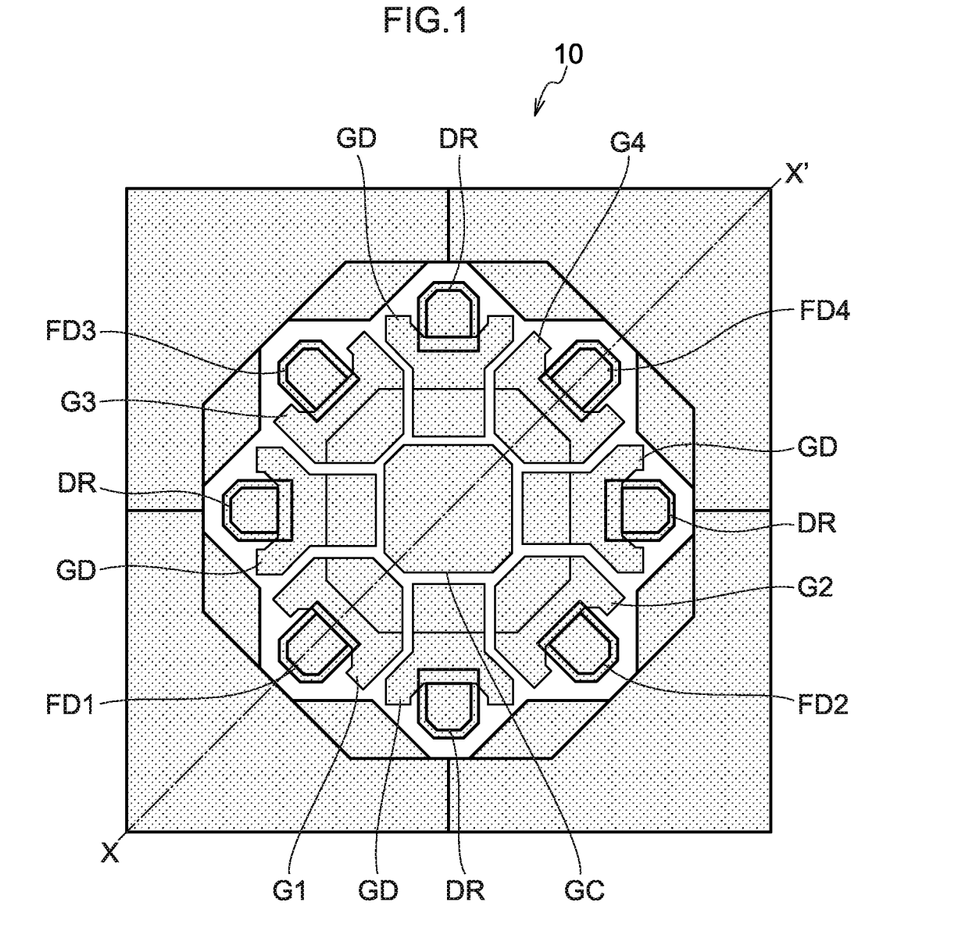
FIG. 1 is a plan view of an example of a semiconductor device pertaining to the embodiment.
Figure 2:
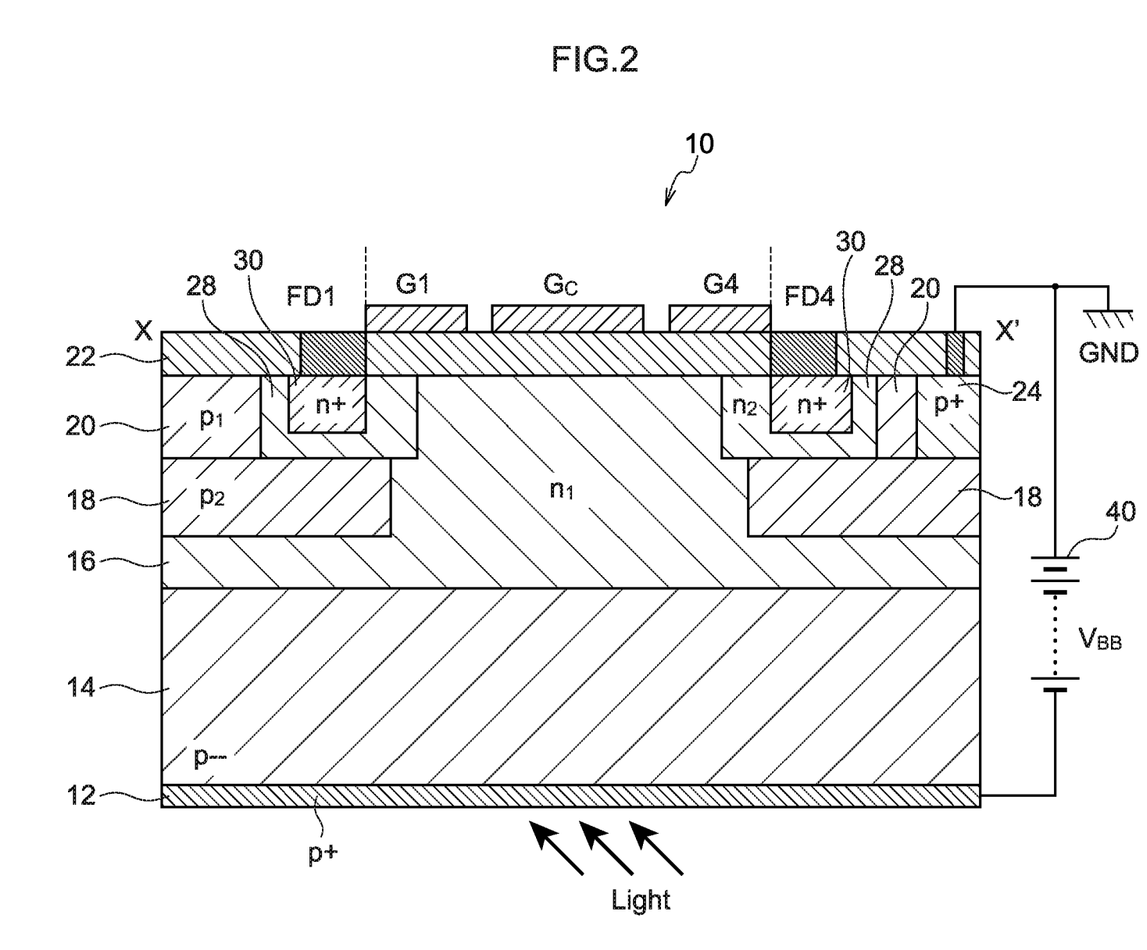
FIG. 2 is a sectional view, taken along line X-X', of the semiconductor device shown in FIG. 1.

FIG. 1 is a plan view of a semiconductor device 10 pertaining to this embodiment. Furthermore, FIG. 2 is a sectional view, taken along line X-X', of the semiconductor device 10 shown in FIG. 1. The semiconductor device 10 pertaining to this embodiment, shown in FIG. 1 and FIG. 2, can be provided at a region corresponding to one pixel of a solid-state imaging device used as a distance image sensor utilizing the indirect ToF method.

It will be noted that in this embodiment a case where an example of a first conductivity type is a p-type and an example of a second conductivity type is an n-type will be described. It will be noted that in the present disclosure the first conductivity type may also be an n-type and the second conductivity type may also be a p-type.

As shown in FIG. 1, the semiconductor device 10 pertaining to this embodiment includes a central gate GC, transfer gates G1 to G4, drain gates GD, floating diffusion layer (FD) portions FD1 to FD4, and drain nodes DR.

As shown in FIG. 2, the semiconductor device 10 pertaining to this embodiment also includes a backside electrode 12, a p-type (p--) support substrate 14, a charge collection layer 16, a charge screening layer 18, a pixel isolation layer 20, a buried oxide (BOX) layer 22, a p-type electrode 24, a field limiting layer 28, and an n-type detection electrode 30.

The backside electrode 12 is a p-type silicon (Si) semiconductor substrate and is an example of an electrode layer of the disclosure. When the backside electrode 12 is illuminated with electromagnetic waves such as light, charges are generated in the support substrate 14.

The support substrate 14 of this embodiment is a silicon (Si) semiconductor substrate with an impurity concentration of about $6 \times 10^{11}$ cm$^{-3}$. It will be noted that the thickness of the support substrate 14 (the thickness in the up and down direction in FIG. 2) is determined in accordance with the light to be detected. Furthermore, the material of the support substrate 14 is also determined in accordance with the light to be detected and is not limited to silicon, for example, so that germanium (Ge), cadmium telluride (CdTe), and zinc cadmium telluride (ZnCdTe) may also be used, and furthermore the impurity concentration is also not limited to the impurity concentration mentioned in this embodiment.

The charge collection layer 16, which is an n-type (n–) well layer, is provided on the surface of the support substrate 14 opposite the surface on which the backside electrode 12 is provided. The charge collection layer 16 of this embodiment is an example of a fourth semiconductor layer of the disclosure.

Furthermore, the charge collection layer 16 of this embodiment also has the function of causing electrons to drift in a direction along a second surface of the BOX layer 22 toward the detection electrode 30. The charge collection layer 16 of this embodiment is preferably provided at least on the underside of the charge screening layer 18 and is more preferably provided at the entire area between the p-type semiconductor layers, such as the charge screening layer 18 and the electrode 24, and the support substrate 14.

The charge screening layer 18 is a layer provided so that the charges collected by the charge collection layer 16 do not directly enter the detection electrode 30, and is a p-type semiconductor layer (a p– layer). The charge screening layer 18 is an example of a second semiconductor layer of the disclosure.

The pixel isolation layer 20 is a layer provided for isolating the pixel from adjacent pixels, and is a p-type semiconductor layer (a p– layer).

The BOX layer 22 is an example of an insulation layer of the disclosure. A silicon-on-insulator (SOI) semiconductor layer is formed on the surface of the BOX layer 22 that is not the surface on the support substrate 14 side. In the example shown in FIG. 2, the central gate GC and the transfer gates G1, G4 are formed on the SOI semiconductor layer.

The electrode 24 is electrically connected to the backside electrode 12, and a voltage $V_{BB}$ is applied to the electrode 24 by a power source 40 when depleting the support substrate 14 and the charge collection layer 16. The voltage $V_{BB}$ is determined in accordance with the extent of depletion of the support substrate 14 or the thickness of the support substrate 14. The electrode 24 of this embodiment is an example of a first semiconductor layer of the disclosure.

The field limiting layer 28 is provided around the detection electrode 30, and is a layer provided to limit the electric field and thus reduce dark current.

The detection electrode 30 is an electrode that detects the charges generated by the illumination of the backside electrode 12 with the electromagnetic waves. The detection electrode 30 is part of the configuration of the FD portions. The detection electrode 30 of this embodiment is an example of a third semiconductor layer of the disclosure.

The semiconductor device 10 pertaining to this embodiment employs shallow trench isolation (STI) for the element isolation structure. By employing STI for the element isolation structure, the occurrence of potential barriers and dips caused by gaps between gates can be inhibited.

The action of the semiconductor device 10 will now be described using FIG. 2. When the backside electrode 12 of the semiconductor device 10 is illuminated with the electromagnetic waves, the charges generated in the backside electrode 12 by the illumination with the electromagnetic waves are collected by the charge collection layer 16. The charges collected by the charge collection layer 16 are pulled up by the transfer gates G1, G4 that are formed by the SOI semiconductor layer and to which a predetermined voltage is applied.

The charges pulled up by the transfer gates G1, G4 are transferred to the FD portions FD1, FD4 of the N-type semiconductor layer (N+ layer). Then, the charges transferred to the FD portions FD1, FD4 are extracted as a signal from the detection electrode 30.

Furthermore, the transfer gates G1 to G4 and the FD portions are N layers and have the same potential. For that reason, some of the charges pulled up by the transfer gates G1, G4 end up entering directly entering the FD portions without involving the transfer gates G1, G4. For that reason, as shown in FIG. 2, the charge screening layer 18 that screens the charges is provided under the FD portions, so that the charges coming from the back side do not directly enter the FD portions.

When a solid-state imaging device using the semiconductor device 10 pertaining to this embodiment performs imaging, the voltage applied to the transfer gates G1 to F4 during the imaging period (the period of illumination with light) is switched. When the timing of the illumination with light shifts, the quantities of the signal charges discharged by the detection electrode 30 provided in correspondence to the transfer gates G1 to G4 differ. In a case where the light with which the device is illuminated is a light pulse for distance measurement, it becomes possible for the solid-state imaging device using the semiconductor device 10 pertaining to this embodiment to estimate the delay time of the light pulse from a comparison of the quantities of the signal charges that are discharged.

Additionally, the semiconductor device 10 pertaining to this embodiment is characterized in that the FD portions FD1 to FD4 and the transfer gates G1 to G4 are adjacent in plan view. Because the FD portions FD1 to FD4 and the transfer gates G1 to G4 are adjacent in plan view, variations in distance between the FD portions FD1 to FD4 and the transfer gates G1 to G4 caused by process variations cease.

In the semiconductor device 10 pertaining to this embodiment, the FD portions FD1 to FD4 are self-alignedly formed. That is, in the semiconductor device 10 pertaining to this embodiment, the FD portions FD1 to FD4 and the transfer gates G1 to G4 are fabricated by self-alignment. By using self-alignment, it becomes possible to fabricate the FD portions FD1 to FD4 and the transfer gates G1 to G4 so that they are adjacent in plan view.

Figure 3:
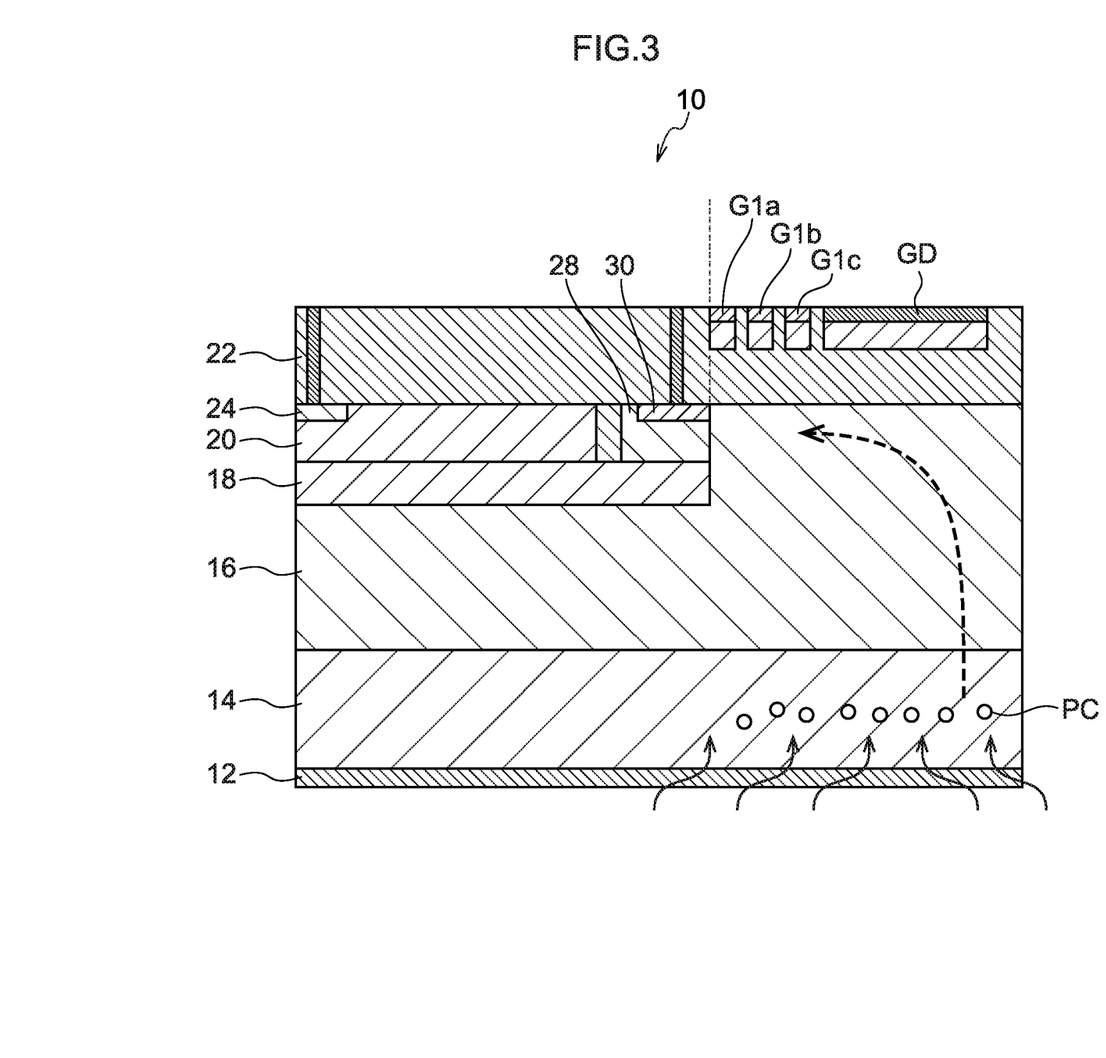
FIG. 3 is a sectional view of an example of the semiconductor device.

The transfer gates G1 to G4 formed by the SOI semiconductor layer may also have a configuration where a plurality of electrodes that have been fabricated are disposed a predetermined interval apart from each other. FIG. 3 is a sectional view of the semiconductor device 10. FIG. 3 shows an example where, instead of the transfer gate G1, transfer gates G1a, G1b, G1c are fabricated by an SOI semiconductor layer in such a way that they are disposed a predetermined interval apart from each other. Additionally, the transfer gate G1a is fabricated so as to be adjacent to an FD portion FD in plan view.

As shown in FIG. 3, when the transfer gate has a configuration where a plurality of electrodes that have been fabricated are disposed a predetermined interval apart from each other, different voltages can be applied to the electrodes of the transfer gates (the transfer gates G1a, G1b, G1c). That is, by applying different voltages to the electrodes of the transfer gates and applying a potential gradient, fine control of the potential gradient becomes possible. Additionally, in the semiconductor device 10 shown in FIG. 3, efficient collection of charges PC generated in the backside electrode 12 by the illumination with the electromagnetic waves becomes possible.

Figure 4:
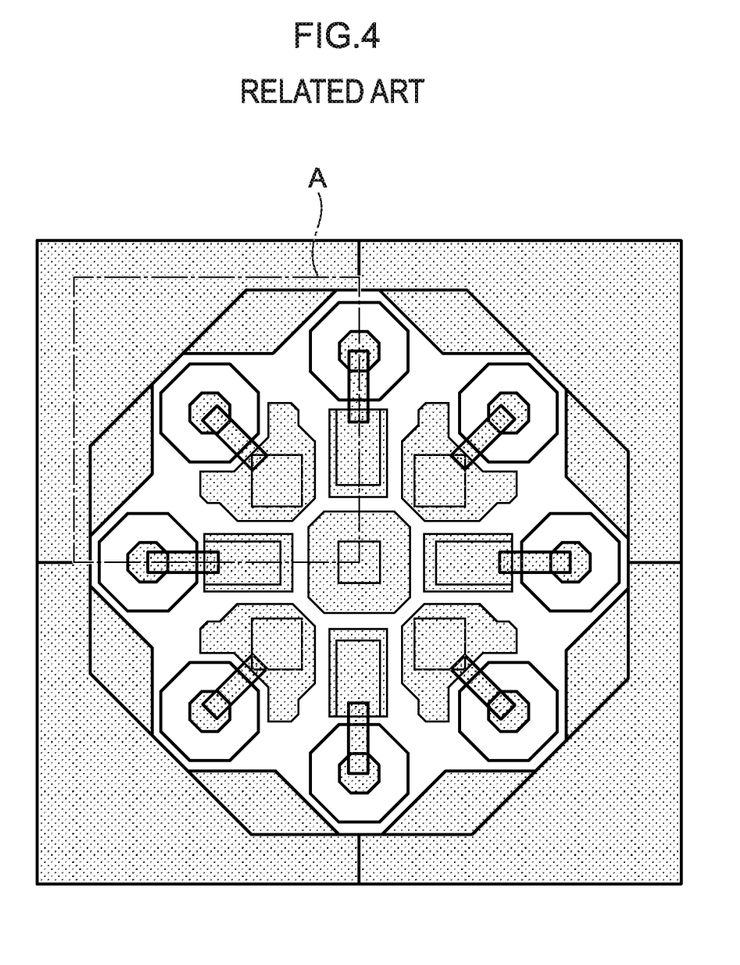
FIG. 4 is a plan view of a semiconductor device of a comparative example.
Figure 5:
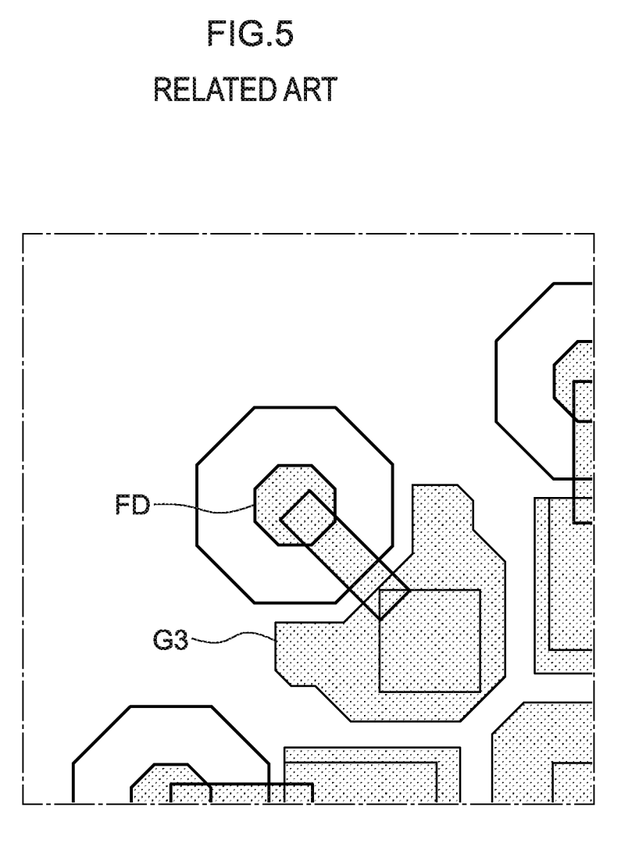
FIG. 5 is a plan view of the semiconductor device of the comparative example.
Figure 6:
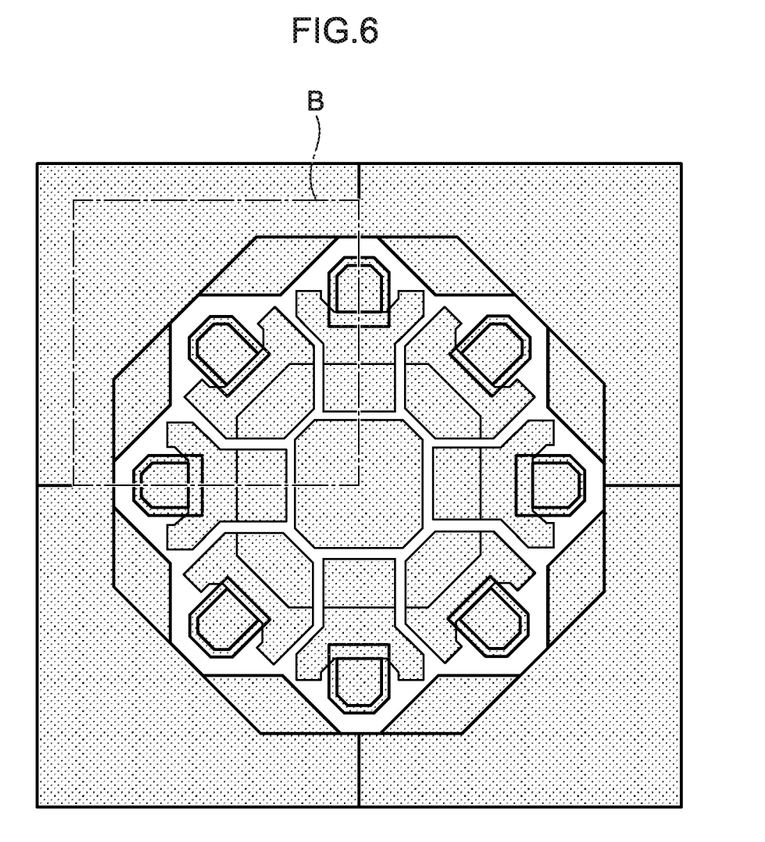
FIG. 6 is a plan view of an example of the semiconductor device pertaining to the embodiment.
Figure 7:
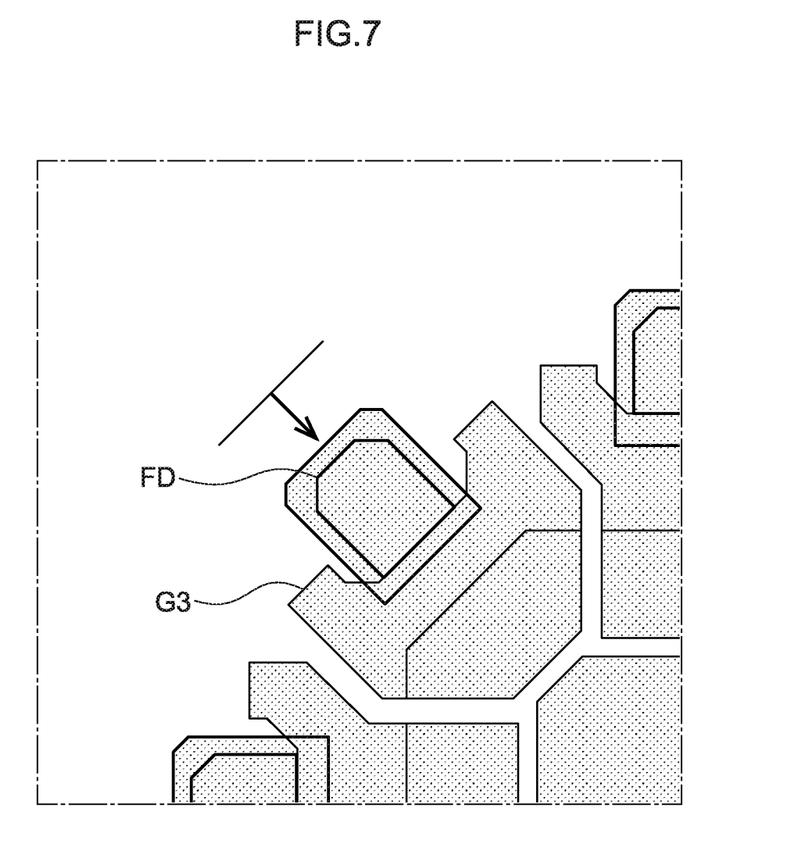
FIG. 7 is a plan view of an example of the semiconductor device pertaining to the embodiment.

The effects of the semiconductor device 10 pertaining to this embodiment will now be described. FIG. 4 and FIG. 5 are plan views of a semiconductor device of a comparative example. FIG. 5 shows an enlargement of the range denoted by reference sign A in FIG. 4. This comparative example is disclosed in S. Lee, K. Yasutomi, M. Morita, H. Kawanishi, and S. Kawahito, "A Time-of-Flight Range Sensor Using Four-Tap Lock-In Pixels with High Near Infrared Sensitivity for LiDAR Applications," MDPI Sensors 2020, 20, 116 (December 2019). Furthermore, FIG. 6 and FIG. 7 are plan views of the semiconductor device 10 pertaining to this embodiment. FIG. 7 shows an enlargement of the range denoted by reference sign B in FIG. 6.

In the semiconductor device of the comparative example, as shown in FIG. 5, there is distance between the transfer gate G3 and the FD portion FD. Additionally, if the interval between the transfer gate G3 and the FD portion FD becomes larger due to manufacturing variations, a potential barrier is formed in the FD portion FD and the charges are not transferred to the FD portion FD even when the transfer gate G3 is switched on. Conversely, if the interval between the transfer gate G3 and the FD portion FD becomes smaller due to manufacturing variations, a potential barrier is not formed in the FD portion FD and the charges end up being transferred to the FD portion even when the transfer gate G3 is switched off.

By contrast, in the semiconductor device 10 pertaining to this embodiment, as shown in FIG. 7, the transfer gate G3 and the FD portion FD are adjacent in plan view as a result of self-aligning the fabrication of the transfer gate and the FD portion. In the semiconductor device 10 pertaining to this embodiment, by self-aligning the fabrication of the transfer gate and the FD portion, the distance between the transfer gate and the FD portion becomes zero, and variations in distance between the transfer gate and the FD portion caused by manufacturing variations that had arisen in the semiconductor device of the comparative example cease.

In this way, in the semiconductor device 10 pertaining to this embodiment, because the transfer gate and the FD portion are adjacent in plan view, the charges generated by illumination with the electromagnetic waves can be efficiently extracted from the detection electrode 30 compared to a case where the transfer gate and the FD portion are not adjacent.

Furthermore, in the semiconductor device of the comparative example, the area of the FD portion is large and miniaturization including the mounting of the read-out circuit has been difficult. By contrast, in the semiconductor device 10 pertaining to this embodiment, the FD portion can be fabricated close to the transfer gate, so miniaturization becomes possible compared to the semiconductor device of the comparative example.

In the semiconductor device 10 pertaining to this embodiment, the degree of integration can be enhanced and the charge collection efficiency can be enhanced compared to the semiconductor device of the comparative example, so the semiconductor device 10 is suitable for use in a solid-state imaging device used to measure distances to objects.

It will be noted that the configuration of the semiconductor device 10 described in the above embodiment is an example and can be changed depending on the circumstances in a range that does not depart from the spirit of the disclosure.

It is an object of the present disclosure to provide a semiconductor device where the charge collection efficiency is enhanced by enhancing the degree of integration.

A semiconductor device according to a first aspect of the present disclosure in which an SOI substrate having an element region in which circuit elements are formed, an insulation layer having a first surface adjoining the SOI substrate, and a support substrate of a first conductivity type are laminated. The semiconductor device includes a first semiconductor layer of the first conductivity type, which is provided at a second region different from a first region corresponding to the element region and is formed on the support substrate adjoining a second surface opposite the first surface of the insulation layer adjoining the SOI substrate, a second semiconductor layer of the first conductivity type, which is provided at a region that includes at least a region covering the first semiconductor layer and the first region and is a partial region formed on the support substrate adjoining the second surface of the insulation layer, a third semiconductor layer of a second conductivity type, which is formed on the support substrate adjoining the second surface of the insulation layer, a fourth semiconductor layer of the second conductivity type, which forms a potential barrier and is provided between the support substrate and a part of the second surface of the insulation layer provided with the first semiconductor layer, the second semiconductor layer, and the third semiconductor layer formed on the support substrate adjoining the second surface of the insulation layer, and an electrode layer of the first conductivity type, which is provided on a surface of the support substrate opposite a surface adjoining the third semiconductor layer and is configured to apply a potential that depletes the support substrate, wherein on the SOI substrate, a transfer electrode configured to transfer charges generated at the support substrate to the third semiconductor layer is formed in a region different from the element region, and the transfer electrode and the third semiconductor layer are adjacent in plan view.

A semiconductor device according to a second aspect of the present disclosure is the first aspect of the present disclosure, wherein the transfer electrode and the third semiconductor layer are formed by self-alignment.

A semiconductor device according to a third aspect of the present disclosure is the first aspect of the present disclosure, wherein the transfer electrode includes a plurality of electrodes disposed an interval apart from each other.

According to the present disclosure, there can be provided a semiconductor device where the degree of integration is enhanced and the charge collection efficiency is enhanced as a result of the transfer electrode and the third semiconductor layer being adjacent in plan view.

What is claimed is:

1. A semiconductor device in which an SOI substrate having an element region in which circuit elements are formed, an insulation layer having a first surface adjoining the SOI substrate, and a support substrate of a first conductivity type are laminated, the semiconductor device comprising:
   a first semiconductor layer of the first conductivity type, which is provided at a second region different from a first region corresponding to the element region and is formed on the support substrate adjoining a second surface opposite the first surface of the insulation layer adjoining the SOI substrate;
   a second semiconductor layer of the first conductivity type, which is provided at a region that includes at least a region covering the first semiconductor layer and the first region and is a partial region formed on the support substrate adjoining the second surface of the insulation layer;
   a third semiconductor layer of a second conductivity type, which is formed on the support substrate adjoining the second surface of the insulation layer;
   a fourth semiconductor layer of the second conductivity type, which forms a potential barrier and is provided between the support substrate and a part of the second surface of the insulation layer provided with the first semiconductor layer, the second semiconductor layer, and the third semiconductor layer formed on the support substrate adjoining the second surface of the insulation layer; and
   an electrode layer of the first conductivity type, which is provided on a surface of the support substrate opposite a surface adjoining the third semiconductor layer and is configured to apply a potential that depletes the support substrate, wherein:
   on the SOI substrate, a transfer electrode configured to transfer charges generated at the support substrate to the third semiconductor layer is formed in a region different from the element region, and
   the transfer electrode and the third semiconductor layer are adjacent in plan view.

2. The semiconductor device of claim 1, wherein the transfer electrode and the third semiconductor layer are formed by self-alignment.

3. The semiconductor device of claim 1, wherein the transfer electrode includes a plurality of electrodes disposed an interval apart from each other.

* * * * *